United States Patent
Novak et al.

(10) Patent No.: US 6,870,252 B2
(45) Date of Patent: Mar. 22, 2005

(54) CHIP PACKAGING AND CONNECTION FOR REDUCED EMI

(75) Inventors: Istvan Novak, Maynard, MA (US); Shlomo D. Novotny, Wayland, MA (US); Kenneth M. Weiss, Westford, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/464,646

(22) Filed: Jun. 18, 2003

(65) Prior Publication Data

US 2005/0035436 A1 Feb. 17, 2005

(51) Int. Cl.⁷ .................. H01L 23/52; H01L 23/34; H01L 21/44; H01L 21/48; H01L 21/50
(52) U.S. Cl. .................. 257/691; 257/724; 438/107; 438/598; 361/760; 361/780; 361/783; 361/816; 361/818
(58) Field of Search .................. 257/691, 724; 438/107, 598; 361/760, 780, 783, 816, 818, 736, 748

(56) References Cited

U.S. PATENT DOCUMENTS

| | | |
|---|---|---|
| 5,294,826 A | 3/1994 | Marcantonio et al. |
| 6,219,254 B1 | 4/2001 | Akerling et al. |
| 6,294,407 B1 | 9/2001 | Jacobs |
| 6,297,551 B1 | 10/2001 | Dudderar et al. |
| 6,320,257 B1 | 11/2001 | Jayaraj et al. |
| 6,339,253 B1 | 1/2002 | Corisis |
| 6,525,407 B1 | 2/2003 | Drewery |
| 6,594,153 B1 * | 7/2003 | Zu et al. .................. 361/792 |
| 2001/0032738 A1 * | 10/2001 | Dibene et al. .............. 174/260 |

FOREIGN PATENT DOCUMENTS

WO    03/041466    5/2003

OTHER PUBLICATIONS

Graf, "Modern Dictionary of Electronics," p. 1112.*

* cited by examiner

Primary Examiner—Carl Whitehead, Jr.
Assistant Examiner—Nema Berezny
(74) Attorney, Agent, or Firm—Meyertons Hood Kivlin Kowert & Goetzel, P.C.; B. Noël Kivlin; Erik A. Heter

(57) ABSTRACT

A chip package for reduced EMI. In one embodiment, a chip package includes a semiconductor chip mounted on a substrate. First and second horizontal conductors may be present within the substrate. The semiconductor chip is coupled to the first and second horizontal conductors by a first and second pluralities of vertical conductors, respectively. The silicon chip may receive power via the first horizontal conductor and the first plurality of vertical conductors. The first and second horizontal conductors are connected to external connectors by third and fourth pluralities of vertical conductors, respectively. One or more capacitors may be electrically coupled between the first and second horizontal conductors.

26 Claims, 5 Drawing Sheets

CHIP PACKAGING AND CONNECTION FOR REDUCED EMI

BACKGROUND OF THE INVENTION

1. Field of the Invention

This invention relates to electronic circuits, and more particularly, to packaging of integrated circuits.

2. Description of the Related Art

Semiconductor chips that consume a large amount of power and/or operate at high frequencies require a power connection which has low impedance over a wide frequency band. One method of achieving a low impedance power connection is to use a large number of conductors from the semiconductor chip (typically contained within a package) to the printed circuit board to which it is connected.

Switching circuitry on a semiconductor chip may generate a significant amount of electrical noise. This noise may escape the packaging in which the semiconductor chip is contained in various ways, such as through the radiation of current loops on the chip and within the package and common-mode radiation created by electrical noise radiating out through the low impedance connection. The escaping electrical noise may lead to electromagnetic interference (EMI) with other components, which may adversely affect their operation. Thus, it is desirable to prevent or minimize the escaping of electrical noise from the package of a semiconductor chip.

One circuit configuration for minimizing the amount of noise that may escape is shown in FIG. 1. In the embodiment shown, the core power is provided to a silicon chip in a package through pins that are placed near the horizontal center of the package. Such a configuration may block core transient current from getting outside the package, but may do little to stop noise leakage through the direct vertical connections from the silicon core to a printed circuit board (PCB) via the pins.

SUMMARY OF THE INVENTION

A chip package for reduced EMI is disclosed. In one embodiment, a chip package includes a semiconductor chip mounted on a substrate. First and second horizontal conductors may be present within the substrate. The semiconductor chip is coupled to the first and second horizontal conductors by first and second pluralities of vertical conductors, respectively. The silicon chip may receive power via the first horizontal conductor and the first plurality of vertical conductors. The first and second horizontal conductors are connected to terminals by third and fourth pluralities of vertical conductors, respectively. In some embodiments, one or more capacitors may be electrically coupled between the first and second horizontal conductors.

In one embodiment, the first horizontal conductor may be a core power plane, while the second horizontal conductor may be a ground plane. Core power may be that power that is distributed to the core of the silicon chip in the package. In some embodiments, the core power may have different voltage requirements than any I/O cells that provide an interface between external devices and the core logic of the silicon chip. In such embodiments, the core power and the I/O power may be distributed separate from each other. In other embodiments, the core power and the I/O cell power may have the same voltage requirements, and thus core power and I/O cell power may be distributed together (i.e. through the same connections).

The chip package may also include a lid. The lid may enclose the silicon chip as well as one or more capacitors. This may help in containing electromagnetic energy within the chip package. The third and fourth vertical conductors may, in various embodiments, be located near the periphery of the chip package. The capacitors within the chip package may be located near the third and fourth vertical conductors. In one embodiment, the terminals may be located on a bottom side of the package or substrate, while in another embodiment the terminals may be located on an upper side of the package or substrate. The terminals may be partially or wholly located within the substrate or the semiconductor package in some embodiments, while in other embodiments, the terminals are partially or wholly located outside of the substrate and/or semiconductor package.

BRIEF DESCRIPTION OF THE DRAWINGS

Other aspects of the invention will become apparent upon reading the following detailed description and upon reference to the accompanying drawings in which.

Figure 1:
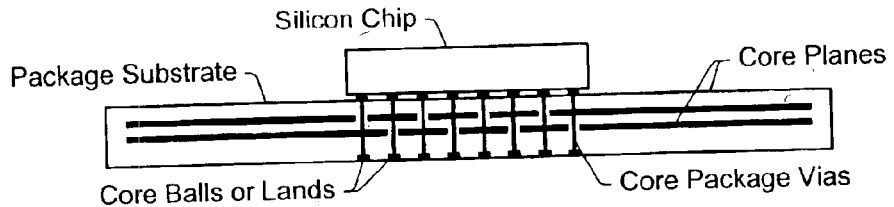
FIG. 1 (Prior Art) is a side view of illustrating one embodiment of a connection scheme for connecting core power to an integrated circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
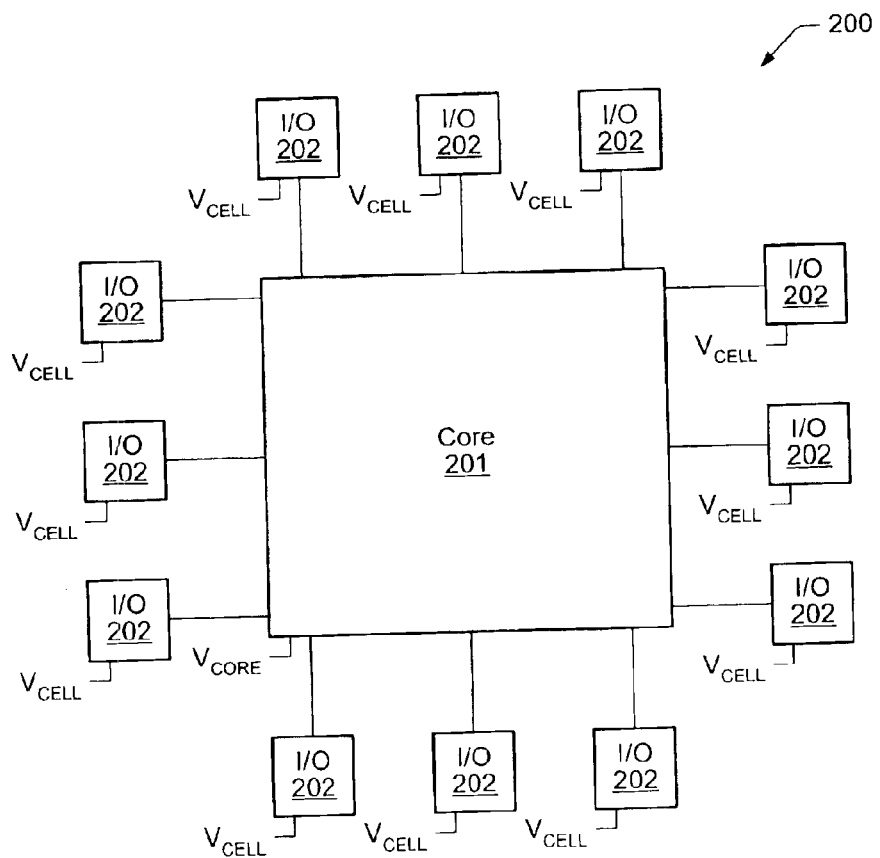
FIG. 2 is a block diagram illustrating one embodiment of an integrated circuit.

Turning now to FIG. 2, a block diagram illustrating one embodiment of an integrated circuit is shown. In the embodiment shown, integrated circuit (IC) 200 includes core 201. Core 201 is representative of circuitry embodied within IC 200 that performs the primary function of the IC. As such, core 201 may represent a large variety of circuitry. In various embodiments, the functions performed by core 201 may be that of a microprocessor, a digital signal processor, an interface chip (e.g. a chip to interface a processor to a peripheral bus), a peripheral controller, a floating point gate array (FPGA), or whatever other functions that IC 200 is designed to perform, as desired.

FIG. 2 also illustrates a plurality of I/O (input/output) cells 202 coupled to core 201. I/O cells 202 are configured to provide an interface between core 201 and other circuitry external to integrated circuit 200. In particular, I/O cells 202 may transmit signals generated within core 201 to external devices, or may receive and convey externally generated signals to core 201. In one embodiment, I/O cells 202 may be located on the same silicon die as core 201, while in another embodiment, I/O cells 202 are separate from core 201.

In one embodiment, core 201 and I/O cells 202 have different voltage and current requirements and therefore receive power from different sources. In the embodiment shown, core 201 receives a voltage denoted as $V_{core}$, while I/O cells 202 receive a voltage denoted as $V_{cell}$. For example, $V_{cell}$ may be 3.3 volts, while $V_{core}$ may be 1.2 volts. The amount of current consumed by core 201 and the plurality of I/O cells 202 may vary also. As such, core power may be provided separately from the power provided to I/O cells 202. Furthermore, since core power may be separate from the power for I/O cells 202, a printed circuit board upon which integrated circuit 200 is mounted upon may be configured to provide only power for the I/O cells 202, but not power for core 201.

Figure 5:
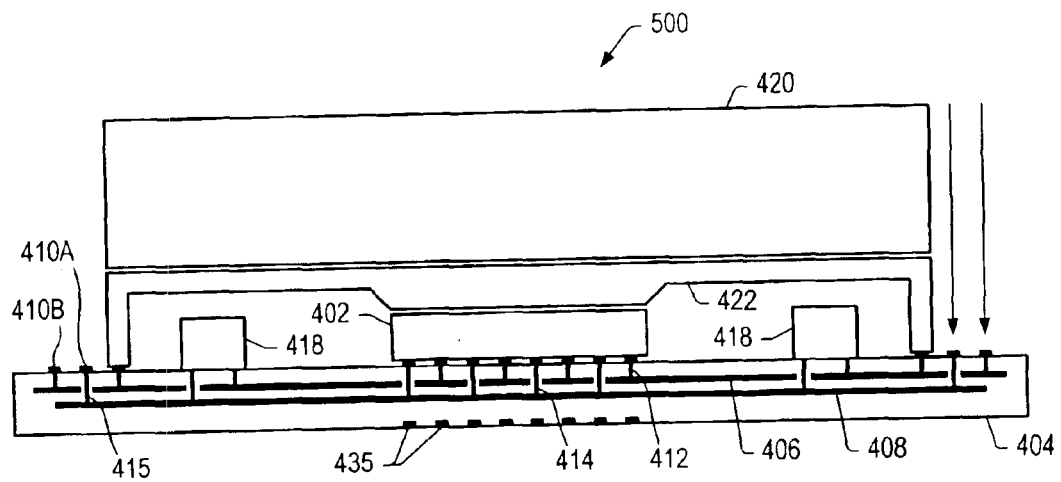
FIG. 5 is a side view of another embodiment of a chip package.
Figure 6:
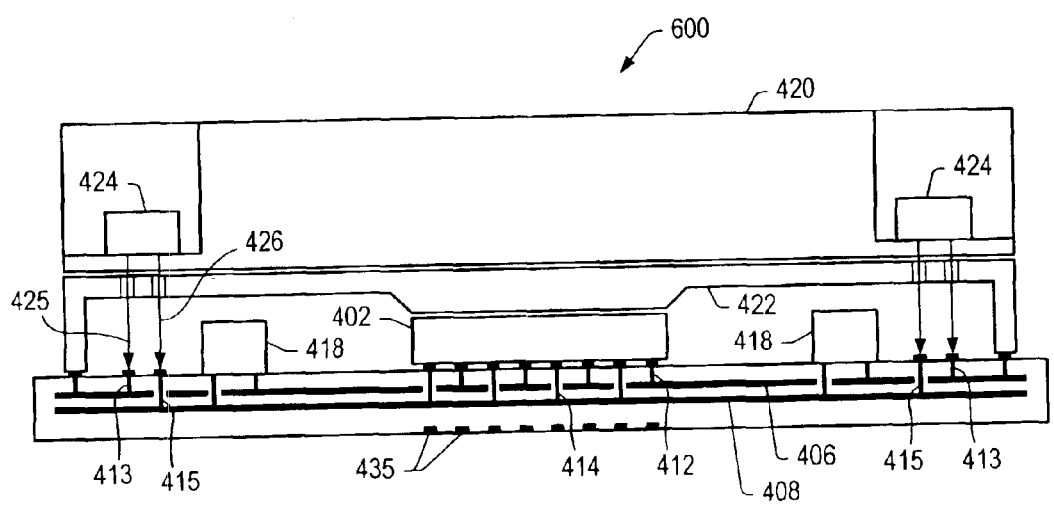
FIG. 6 is a side view of another embodiment of a chip package.

In some embodiments, the required voltage of core power and I/O cell power may be the same. For example, embodiments are possible and contemplated wherein $V_{core}$=3.3 volts and $V_{cell}$=3.3 volts also. In such embodiments, core power and I/O cell power may be provided together through the same power connections. While the embodiments discussed below in reference to FIGS. 4, 5, and 6 are directed to the supplying of core power to the silicon chip, it is understood that I/O cell power may also be provided through these connections, particularly for embodiments where I/O cell power and core power have the same voltage.

Figure 3A:
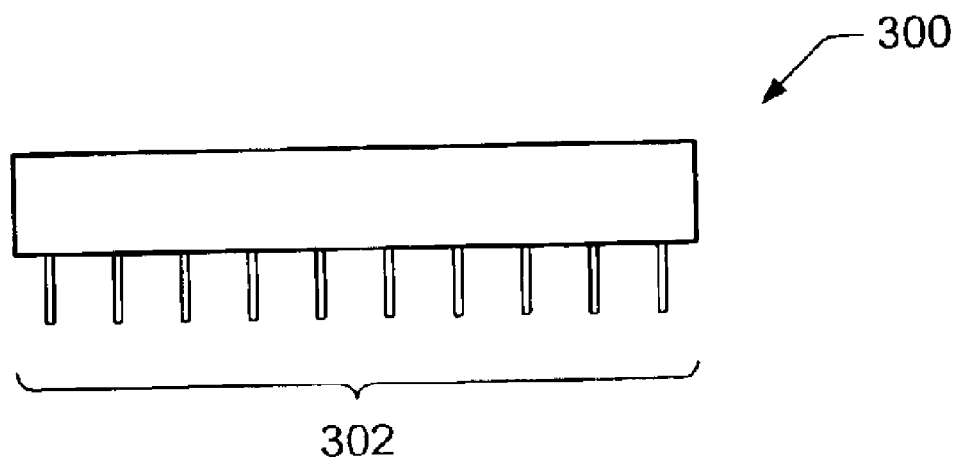
FIG. 3A is a side view of one embodiment of a chip package having a pin grid array (PGA)

FIG. 3A is a side view of one embodiment of a chip package having a pin grid array (PGA). In the embodiment shown, chip package 300 includes a plurality of pins 302. Pins 302 may be arranged in a grid, and may be coupled to a printed circuit board (or other type of circuit carrier) either by a socket (e.g.; a zero-insertion force, or ZIF socket), or by soldering into plated through-holes.

Figure 3B:
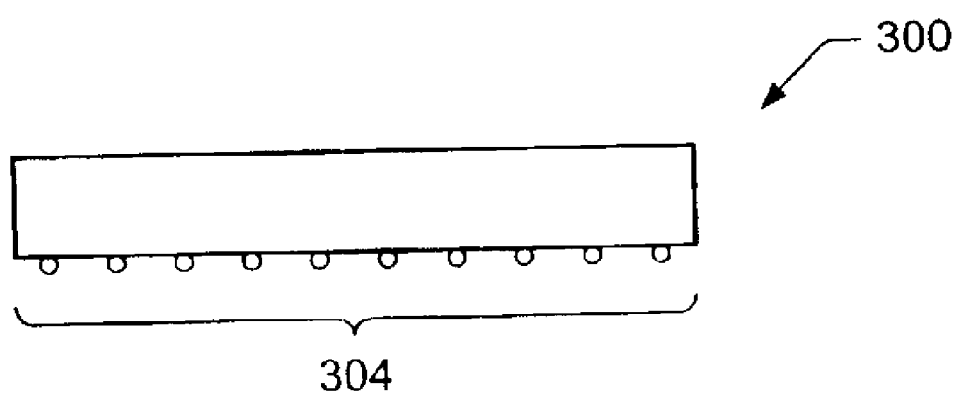
FIG. 3B is a side view of one embodiment of a chip package having a ball grid array (BGA)

FIG. 3B is a side view of another embodiment of a chip package having a ball grid array (BGA). In the embodiment shown, chip package 300 includes a plurality of solder balls 304. Solder balls 304 may be arranged in a grid. A PCB or other type of circuit carrier (e.g., an interposer located between chip package 300 and a PCB) may include pads that are arranged as to allow contact with the solder balls. The pads may allow chip package 300 to be soldered to the circuit carrier.

In some embodiments, chip packages 300-A and 300-B may each include terminals (e.g. pins, pads, solder balls) on an upper surface (e.g. a top side) as well as those already shown. Such embodiments will be discussed in further detail in reference to FIGS. 5 and 6.

It should also be noted that embodiments having a land grid array (including elastomeric connectors) are possible and contemplated. In one embodiment, a chip package having a land grid array may appear similar to chip package 300-B of FIG. 3B. Chip package 300-B may also be a flip-chip.

Figure 4A:
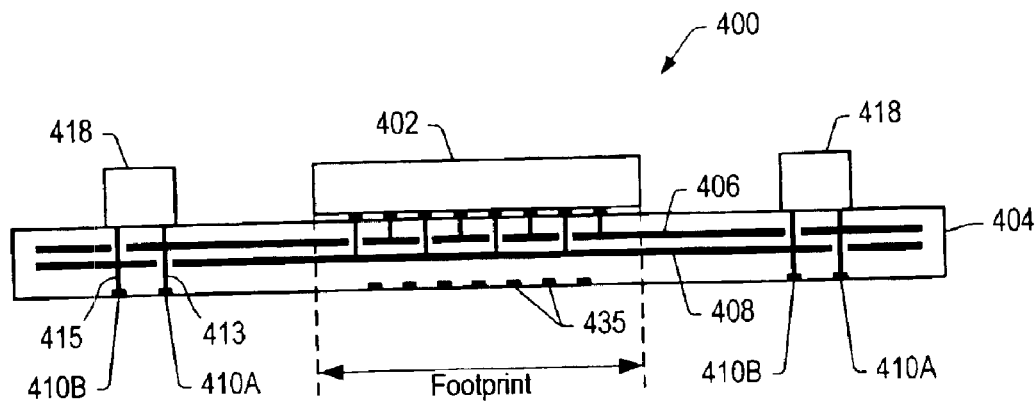
FIG. 4A is a side view of another embodiment of a chip package.

Turning now to FIG. 4A, a side view of an embodiment of a chip package is shown. Chip package 400 may be either a PGA type package as shown in FIG. 3A, a BGA or LGA type package as shown in FIG. 3B, or other type of circuit package.

Figure 4B:
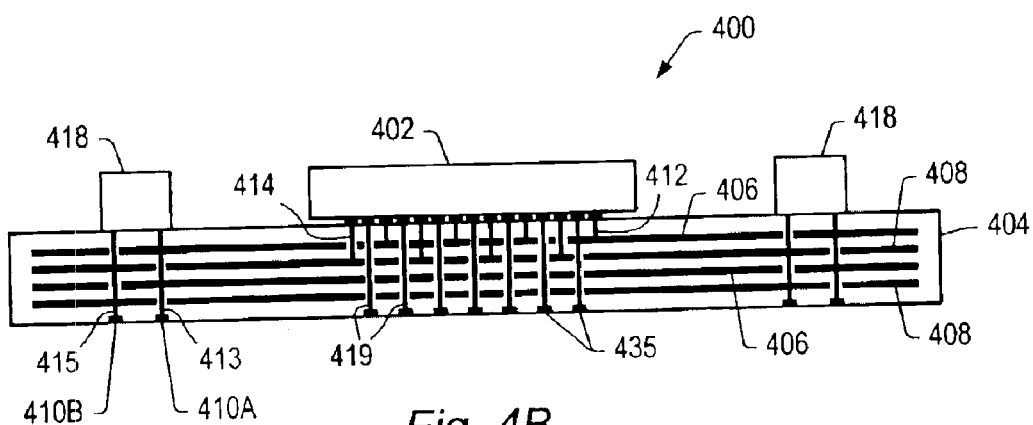
FIG. 4B is a side view of an embodiment of a chip package having multiple pairs of conductive planes.

In the embodiment shown, a chip package 400 includes a silicon chip 402 coupled to substrate 404. In one embodiment, silicon chip 402 may be an integrated circuit such as that shown above in FIG. 2. As such, silicon chip 402 may include a core configured perform one of the various functions of core 201 discussed in the description of FIG. 2. Silicon chip 402 may also include a plurality of I/O cells such as I/O cells 202 shown in FIG. 2 which provide an interface between silicon chip 402 and other circuitry external to chip package 400. In an alternative embodiment, I/O cells 202 may be located on one or more die separate from silicon chip 402. The I/O cells may, in some embodiments, receive power separately from the core power provided to silicon chip 402. Chip package 400 may also include an enclosure (not shown here) in which the illustrated elements are housed. A plurality of signal pads 435 may be present to couple external devices to the signals. A plurality of signal vias may couple signal pads 435 to chip 402. The signal vias are not shown here for the sake of simplicity (and are not shown in FIGS. 5 and 6), but are similar to the signal vias 419 which are shown in FIG. 4B.

It should be noted that in some embodiments, that one or more of signal pads 435 and signal vias 419 may be used to convey power to I/O cells present on chip 402. For example, in an embodiment wherein the required voltage for core power is different from the required voltage for I/O cell power, one or more of signal pads 435 and its associated signal via 419 may be dedicated to conveying the voltage to the I/O cells (with at least one other pad/via dedicated to an associated ground). In some embodiments where the required voltages for core power and I/O cell power are the same, power may be delivered to the I/O cells through the same connections that core power is delivered, and thus no signal pins/pad are needed for I/O cell power.

Substrate 404 may be made of a dielectric material. Horizontal conductors 406 and 408 may be located within substrate 404. In one embodiment, horizontal conductors 406 and 408 may be conductive planes, although other embodiments wherein these conductors are not planar are possible and contemplated. Furthermore, in one embodiment, one of the conductive planes may be a core power plane while the other conductive plane is a ground or reference voltage plane. For example, in one embodiment, horizontal conductor 406 may be a core power plane while horizontal conductor 408 is a ground plane. The voltage difference between the core power plane and the ground plane may be the core power voltage required by silicon chip 402.

A first plurality of vertical conductors 412 electrically couple silicon chip 402 to first horizontal conductor 406 while a second plurality of electrical conductor 414 electrically couple silicon chip 402 to second horizontal conductor 408. Horizontal conductor 406 may be electrically coupled to pads 410-A by a third plurality of vertical conductors 413. Thus, an electrical path exists between silicon chip 402 and the pads 410-A via vertical conductors 412, first horizontal conductor 406, and vertical conductors 413. Similarly, a fourth plurality of vertical conductors 415 may electrically couple second horizontal conductor 408 to pads 410-B, thereby providing an electrical path between silicon chip 402 and pads 410-B via vertical conductors 415, horizontal conductor 408, and vertical conductors 414. The provision of these electrical paths in turn provides an electrical path for distributing core power to silicon chip 402 and a return path.

Vertical conductors 412–415 may be vias, wires, or any other type of conducting medium. It should also be noted that vertical conductors 412–415 need not necessarily be vertical (i.e. perpendicular) with respect to the horizontal conductors, and may in fact have a diagonal orientation.

In the embodiment shown in FIG. 4A, pads 410-A and 410-B are located on the bottom side of substrate 404. These pads may be coupled to pins of a pin grid array, solder balls of a ball grid array, or elastomeric connectors of a land grid array. Thus, these pads may allow both the physical and electrical coupling of chip package 400 to a PCB or other type of circuit carrier (e.g., a socket in the case of a pin grid array). In general, pads 410-A and 410B provide an external connector function, and may be virtually any type of connecting device that couples chip package 400 to a core power source. In this embodiment, pads 410-A and 410-B are located at a position within the substrate that is outside of a footprint of silicon chip 402. By positioning the power terminals outside of the footprint of silicon chip 402, current conveyed along either the first or second horizontal conductors must travel some horizontal distance between the silicon chip 402 and an external power source. It should be noted however that embodiments are possible and contemplated wherein the power and ground terminals (e.g. pads 410-A and 410-B) are positioned at a location that is within the footprint of silicon chip 402.

Chip package 400 may also include one or more capacitors 418. In the embodiment shown, capacitors 418 are electrically coupled between the first and second horizontal conductors 406 and 408. As shown in this particular embodiment, capacitors 418 are positioned at the same lateral distance from silicon chip 402 as $3^{rd}$ vertical conductors 413 and fourth vertical conductors 415. Broadly speaking, at least some capacitors 418 in various embodiments of the chip package disclosed herein are located within the proximity of the $3^{rd}$ and $4^{th}$ vertical conductors 413 and 415 (respectively). More generally, at least some capacitors 418 may be located nearer to the $3^{rd}$ and $4^{th}$ vertical conductors 413 and 415 than to silicon chip 402.

Capacitors 418 provide decoupling between core power and ground (or other reference voltage). In addition to reducing core current transients (a source of electromagnetic noise), the presence of capacitors 418 creates a low pass filter that has the effect of blocking core noise from escaping the package. The low-pass filtering function may be useful in filtering out high frequency noise and harmonics (e.g., 10–15 GHz and higher).

Capacitors 418 are, in this embodiment, mounted in the proximity of the third and fourth pluralities of vertical conductors. Other embodiments are possible and contemplated wherein the capacitors are mounted further away from the third and fourth pluralities of vertical conductors. The number of capacitors 418 present in chip package 400 may vary in different embodiments. The amount of capacitance required for effective decoupling and/or one or more target impedances may be a factor in determining the exact number of capacitors that may be present in chip package 400, as well as the physical size of capacitors 418 and the available space within chip package 400.

While the embodiment shown in FIG. 4A (as well as other embodiments shown herein) include package capacitors, it should be noted that embodiments are also possible and contemplated where no package capacitors are present. In those embodiments where the horizontal conductors are planar conductors, the combination of the planar conductors and the dielectric material disposed between them may also provide an amount of capacitance. In such embodiment, the capacitance proved by this internal structure may provide adequate decoupling and/or filtering capacitance, and thus, package capacitors may not be required.

It should be noted that the terms "horizontal" and "vertical" as used herein refer to the orientation of the conductors with respect to the lateral width of substrate 404. It should also be noted that in embodiments where horizontal conductors 406 and 408 are conductive planes, the area covered by the conductive planes does not need to be coextensive with the area covered by the substrate itself. Embodiments are possible and contemplated wherein the area of any conductive planes that may be present is substantially less than the area covered by the substrate. The reader is also reminded that embodiments are possible and contemplated wherein horizontal conductors 406 and 408 are not planar conductors.

FIG. 4B is another embodiment of chip package 400. As with FIG. 4A, the embodiment shown in FIG. 4B may be a PGA, a BGA, and LGA, as discussed above in reference to FIGS. 3A and 3B, or may be another type of package. The embodiment of chip package 400 shown in FIG. 4B includes multiple pairs of horizontal conductors 406 and 408. Since the horizontal conductors may be conductive planes, the embodiment shown herein may represent an embodiment having multiple pairs of power and ground planes. The number of plane pairs (or horizontal conductor pairs in general) that may be present in various embodiments of chip package 400 may depend on factors such as available space, thickness of the substrate, and thickness of the planes (or conductors) themselves, and so forth.

FIG. 5 is a side view of another embodiment of a chip package. Chip package 500. Various elements of FIG. 5 that correspond to those of FIGS. 4A and 4B are numbered identically here for simplicity (this applies to FIG. 6 as well). Furthermore, both FIGS. 5 and 6 may correspond to embodiments of the integrated circuit packages discussed above in reference to FIGS. 3A and 3B. In particular, FIGS. 5 and 6 may correspond to those embodiments discussed above that include connections on a top side or upper surface of the chip package.

In addition to the illustrated features that correspond to the embodiments shown in FIGS. 4A and 4B, chip package 500 also includes a lid 422, with heat sink 420 attached thereto. Lid 422 may provide an enclosure for silicon chip 402 and capacitors 418. Lid 422 may be the only enclosure for chip package 500 in one embodiment, while an additional enclosure may be present in other embodiments. Lid 422 may be constructed of an electrically conductive material and may thus provide shielding for electromagnetic noise that may be generated by the operation of silicon chip 402.

Heat sink 420 is attached to lid 422. Heat sink 420 may conduct heat generated during the operation of silicon chip 402 away from chip package 500. Heat generated by silicon chip 402 may be conducted to heat sink 420 through lid 422.

In the embodiment shown in FIG. 5, pads 410-A and 410-B are located on the upper side of substrate 404, and are outside the periphery of lid 422 and near the periphery of chip package 500 in general. Thus, both pluralities of vertical conductors 413 and 415 extend upward from the horizontal conductors to which they are connected. An external core power connection may be made through the upper side of substrate 404 through these pads. The source of the core power (and return path, e.g., ground) that may be connected to pads 410-A and 410-B may be separate from a PCB or other circuit carrier to which chip package 500 is to be mounted. Thus, a core power plane (and associated reference plane) may not be included in the PCB or other circuit carrier. This may allow the chip package to be optimized for core power distribution, while the PCB may be optimized for signal distribution. Various types of connections to pads 410-A and 410-B may be used, including wire connections.

In some embodiments, pads 410-A and 410-B may be replaced by pins or other types of terminals. For example, in one embodiment, pins may be present in lieu of pads 410-A and 410B, and may thus be connected to wires or a connector that conveys core power and ground to the chip package. In another embodiment, wiring may be soldered to pads 410-A and 410-B in order to provide core power and ground. In general, any type of terminal or other connecting device may be used in order to couple core power to the chip package.

It should also be noted that embodiments are possible and contemplated wherein the third and fourth pluralities of vertical conductors may extend to an upper surface of an electronic package instead of just to the upper surface of the substrate. Furthermore, in some embodiments such as that shown here in FIG. 5, the upper surface of the substrate may be exposed in the vicinity of the pads (or other type of connecting device that may be present) for core power connection.

Moving now to FIG. 6, a side view of another embodiment of a chip package is shown. In the embodiment of chip package 600 shown here, silicon chip 402 receives core power and ground connections via one or more voltage regulator modules 424. Each voltage regulator module 424 is configured to provide core power at the required voltage and current. Pads 410-A and 410-B (which are within the periphery of lid 422 in this particular embodiment) are coupled to each voltage regulator module 424 by connecting conductors 425 (which couples the voltage regulator to first horizontal conductor 406 via third vertical conductors 413) and connecting conductors 426 (which couples the voltage regulator to the second horizontal conductor 408 via fourth vertical conductors 415). Apertures 431 in lid 422 are present in order to allow the passage of connecting conductors 425 and 426 to pads 410-A and 410-B. Connecting conductors 425 and 426 may be flexible conductors (e.g., wires) in some embodiments. In other embodiments, connecting conductors may be rigid conductors (e.g., vias).

In the embodiment of FIG. 6, the connecting conductors 425 and 426 that couple the voltage regulator modules 424 to horizontal conductors 406 and 408 pass through a portion of heat sink 420. In some embodiments, the dimensions of any passage through which connecting conductors 425 and 426 pass through may be such that the passages are substantially filled. Thus, the combination of heat sink 420 and connecting conductors 425/426 filling any passage through the heat sink may prevent electromagnetic noise from escaping through the apertures in lid 422 and the passages in heat sink 420. Furthermore, in some embodiments the apertures in lid 422 may also be substantially filled by connecting conductors 425 and 426.

The various embodiments shown above may greatly reduce the amount of electromagnetic noise (resulting from delivery of core power) from the chip package. In general, each of the embodiments discussed herein may allow for fewer core power connections than embodiments where the core power connections are concentrated towards the center of the package. In embodiments where the core power and ground connections are located on an upper surface of the package (e.g., the embodiments of FIGS. 5 and 6), core power and ground planes may be eliminated from the PCB or other circuit carrier to which the chip package is to be coupled. This may allow for optimization of the chip package for core power distribution while the PCB may be optimized for distributing signals that are sent to or received from the chip package. Optimization of the chip package for core power distribution by connecting core power from an upper surface may result in greater flexibility in positioning signal pins on the bottom side of the package since no provision needs to be made for core power pins. Furthermore, removing any core power current from the PCB may eliminate any potential voltage drop that may appear on PCB power and/or ground planes. Eliminating these voltage drops may further reduce the potential for electromagnetic interference and may result in a more stable electronic system.

Figure 7:
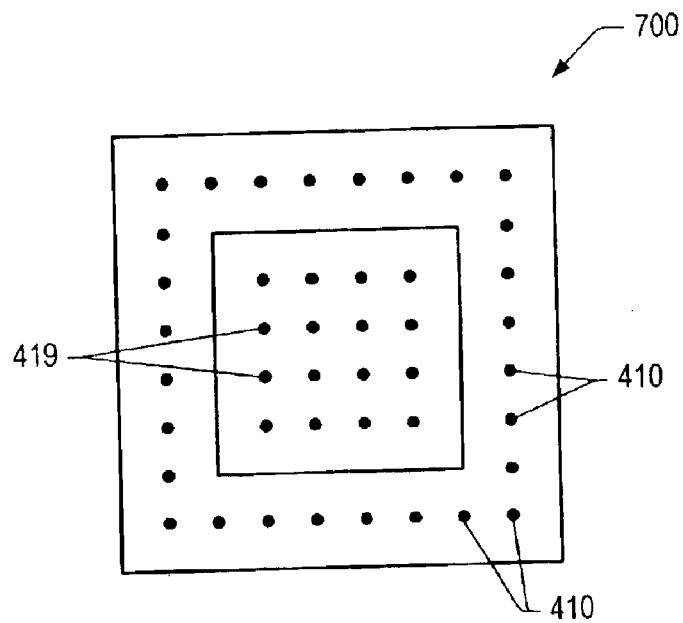
FIG. 7 is a plan view of one embodiment of a chip package.

FIG. 7 is a plan view of one embodiment of a chip package. Chip package 700 may be one of several different types of packages, such as a flip-chip, ball-grid array, land-grid array, pin-grid array, and so on. Chip package 700 may correspond to any of the chip packages discussed above in reference to FIG. 3A through FIG. 6. As such, the connections shown in FIG. 7 may be pins for a PGA, solder balls of a BGA, or elastomeric connectors of an LGA.

In the embodiment shown chip package 700 includes connections for signals, core power and its associated ground (or other reference voltage). Signal connections 419 are generally located more towards the center of chip package 700. Core power/ground connections 410 are generally located towards the periphery of chip package 700. Embodiments are possible and contemplated where there may be some interleaving between power/ground connections 410 and signal connections 419, although the general case may still apply to the majority of connections.

It should be noted that for some embodiments the power/ground connections 410 may be on the opposite side of the chip package with respect to signal connections 419, and therefore such an embodiment may correspond to those discussed above in reference to FIG. 5 or FIG. 6. Embodiments wherein power/ground connections 410 are on the same side as signal connection 419 may correspond to the embodiments discussed above in reference to FIGS. 4A and 4B.

Figure 8:
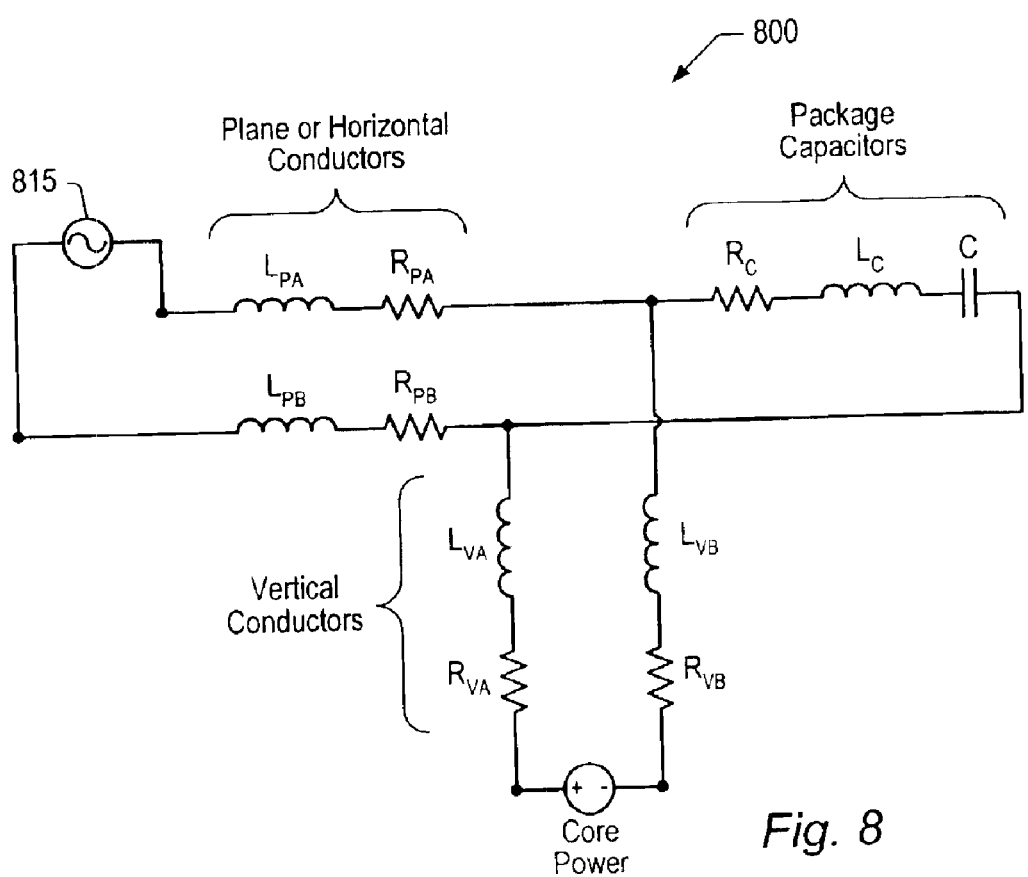
FIG. 8 is a schematic diagram representative of the power connections for one embodiment of a chip package.

FIG. 8 is a schematic diagram representative of the power connections for one embodiment of a chip package. In the embodiment shown, circuit 800 is an electrical circuit that approximates the core power connections of the various embodiments discussed above in FIG. 4A through FIG. 6. Source 815 is representative of core power noise that may be generated by the core of a silicon chip, such as silicon chip 402 discussed above. Resistors $R_{PA}$ and $R_{PB}$ represent equivalent resistances that may be present in the horizontal conductors 406 and 408 of the various embodiments discussed above (which may be conductive planes in some embodiments). Similarly, $L_{PA}$ and $L_{PB}$ represent inductances present in the horizontal conductors 406/408. Resistors $R_{VA}$ and $R_{VB}$ represent resistances that may be present in the vertical conductors 413 and 415, while inductors $L_{VA}$ and $L_{VB}$ represent inductances present in the vertical conductors 413 and 415. Although not explicitly shown here, resistances and inductances corresponding to vertical conductors 412 and 414, which electrically couple silicon chip 402 to horizontal conductors 406 and 408. Resistor $R_C$, inductor $L_C$, and capacitor C represent the equivalent series resistance, the equivalent series inductance, and the capacitance provided by the one or more package capacitors 418 that may be present in a chip package to which the circuit shown here corresponds and/or any capacitor formed by conductive planes with a dielectric disposed there between that may be present within the package.

In the embodiment shown, the portions of the circuit corresponding to vertical conductor 413 (which includes $R_{VA}$, $L_{VA}$) and vertical conductor 415 (which includes $R_{VB}$, and $L_{VB}$) are connected to the rest of the circuit at nodes that lie between the horizontal conductors and the package capacitors. Thus, the circuit configuration corresponds to the physical arrangement of the various elements including the vertical conductors, package capacitors, and horizontal conductors. By placing the vertical conductors that couple core power near the periphery of the package, noise generated in the core may be partially or wholly suppressed by the package capacitors. In contrast, embodiments wherein the vertical conductors are directly connected to the core (which would correspond to the portions corresponding to vertical conductors 413 and 415 shown herein being connected on the other side of the horizontal conductors), the noise suppression effect of the package capacitors might be partially or wholly negated.

It should be noted that while the core power source is shown with a specific polarity, it is not intended to imply that specific polarity for all embodiments. In other embodiments, the polarity may be reversed.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A semiconductor package comprising:
   a substrate;
   a plurality of I/O cells;
   a silicon chip mounted on the substrate, wherein the silicon chip is electrically coupled to the plurality of I/O cells, wherein the I/O cells receive power separately from core power received by the silicon chip;
   a first horizontal conductor and a second horizontal conductor within the substrate;
   a first plurality of vertical conductors, wherein the silicon chip is coupled to the first horizontal conductor by the first plurality of vertical conductors, and wherein the silicon chip receives core power through the first plurality of vertical conductors;
   a second plurality of vertical conductors, wherein the silicon chip is coupled to the second horizontal conductor by the second plurality of vertical conductors;
   a third plurality of vertical conductors coupled to provide an electrical connection between the first horizontal conductor and a first plurality of terminals; and
   a fourth plurality of vertical conductors coupled to provide an electrical connection between the second horizontal conductor and a second plurality of terminals.

2. The semiconductor package as recited in claim 1, wherein the package includes one or more capacitors electrically coupled between the first horizontal conductor and the second horizontal conductor.

3. The semiconductor package as recited in claim 1, wherein the first and second horizontal conductors are conductive planes, wherein the first horizontal conductor is a core power plane and the second horizontal conductor is a ground plane.

4. The semiconductor package as recited in claim 1, wherein the package includes multiple pairs of conductive planes.

5. The semiconductor package as recited in claim 1, wherein the capacitors are positioned in proximity of the third and fourth pluralities of vertical conductors.

6. The semiconductor package as recited in claim 1, wherein the third and fourth pluralities of vertical conductors extend to an upper surface of the electronic package.

7. The semiconductor package as recited in claim 1, wherein the third and fourth pluralities of vertical conductors extend to a lower surface of the substrate.

8. The semiconductor package as recited in claim 7, wherein the package includes a lid, and wherein the first and second pluralities of terminals are outside of a periphery of the lid.

9. The semiconductor package as recited in claim 8, wherein the first and second pluralities of terminals are electrically coupled to a voltage regulator.

10. The semiconductor package as recited in claim 9, wherein the voltage regulator is enclosed within the lid.

11. The semiconductor package as recited in claim 7, wherein the package is configured to be coupled to a printed circuit board (PCB), wherein the printed circuit board excludes any power planes for distributing core power.

12. The semiconductor package as recited in claim 1, wherein the third and fourth pluralities of vertical conductors extend to a lower surface of the package.

13. The semiconductor package as recited in claim 1, wherein the first and second pluralities of terminals are pads configured for soldering to a PCB.

14. The semiconductor package as recited in claim 13, wherein the package includes a ball-grid array.

15. The semiconductor package as recited in claim 1, wherein the package includes a pin-grid array.

16. The semiconductor package as recited in claim 1, wherein the third and fourth pluralities of vertical conductors are near the horizontal periphery of the package.

17. The semiconductor package as recited in claim 1, wherein the substrate comprises a dielectric material.

18. A semiconductor package comprising:
    a substrate;
    a plurality of I/O cells;
    a silicon chip mounted on the substrate;
    a power plane extending within the substrate;
    a power input terminal positioned on the substrate;
    at least a first electrical conductor within the substrate that provides an electrical path between the power plane and the silicon chip for providing core power to the silicon chip, wherein the I/O cells receive power separately from core power received by the silicon chip; and
    at least a second electrical conductor within the substrate that provides an electrical path between the power plane and the power input terminal;
    wherein the power input terminal is positioned at a location on the substrate that is outside of a footprint of the silicon chip.

19. The semiconductor package as recited in claim 18, wherein the semiconductor package includes a ground plane and a ground input terminal, and further includes at least a third conductor within the substrate that provides an electrical path between the ground plane and the silicon chip and at least a fourth conductor that provides an electrical path between the ground input terminal and the ground plane.

20. The semiconductor package as recited in claim 19, wherein the semiconductor package includes at least one capacitor electrically coupled between the power plane and the ground plane.

21. The semiconductor package as recited in claim 20, wherein the capacitor is positioned near the second electrical conductor.

22. The semiconductor package as recited in claim 19, wherein the semiconductor package includes a plurality of power planes and a plurality of ground planes.

23. The semiconductor package as recited in claim 19, wherein the power terminal and the ground terminal are each located on an upper surface of the semiconductor package.

24. The semiconductor package as recited in claim 23, wherein the power terminal and the ground terminal are electrically connected to corresponding power and ground terminals of a voltage regulator.

25. The semiconductor package as recited in claim 19, wherein the power terminal and the ground terminal are each located on a lower surface of the semiconductor package.

26. The semiconductor package as recited in claim 18, wherein the substrate in comprised of a dielectric material.

* * * * *